(12) United States Patent
Yokomichi

(10) Patent No.: US 9,240,426 B2
(45) Date of Patent: Jan. 19, 2016

(54) PHOTOELECTRIC CONVERSION DEVICE

(71) Applicant: Seiko Instruments Inc., Chiba-shi, Chiba (JP)

(72) Inventor: Masahiro Yokomichi, Chiba (JP)

(73) Assignee: SEIKO INSTRUMENTS INC., Chiba (JP)

( * ) Notice: Subject to any disclaimer, the term of this patent is extended or adjusted under 35 U.S.C. 154(b) by 141 days.

(21) Appl. No.: 13/951,019

(22) Filed: Jul. 25, 2013

(65) Prior Publication Data

US 2014/0027621 A1 Jan. 30, 2014

(30) Foreign Application Priority Data

Jul. 26, 2012 (JP) .................................. 2012-166155

(51) Int. Cl.
*H01L 27/146* (2006.01)
*H04N 5/357* (2011.01)
*H04N 5/3745* (2011.01)

(52) U.S. Cl.
CPC ........ *H01L 27/14601* (2013.01); *H04N 5/3575* (2013.01); *H04N 5/37452* (2013.01)

(58) Field of Classification Search
CPC ................... H01L 27/14601; H01L 27/14603; H04N 5/374; H04N 5/3745; H04N 5/37452; H04N 5/376; H04N 5/357; H04N 5/3575
See application file for complete search history.

(56) References Cited

U.S. PATENT DOCUMENTS

| | | | | |
|---|---|---|---|---|
| 5,600,157 A | * | 2/1997 | Abiko et al. | 257/84 |
| 6,384,396 B1 | * | 5/2002 | Mizuno et al. | 250/208.1 |
| 7,782,383 B2 | * | 8/2010 | Olsen et al. | 348/309 |
| 7,847,848 B2 | * | 12/2010 | Ohtsuki et al. | 348/308 |
| 7,880,145 B2 | * | 2/2011 | Yagi et al. | 250/370.09 |
| 7,932,519 B1 | * | 4/2011 | Liu | 257/59 |
| 8,466,402 B2 | * | 6/2013 | Wan et al. | 250/208.1 |
| 8,804,018 B2 | * | 8/2014 | Noda | 348/302 |
| 8,854,517 B2 | * | 10/2014 | Honda et al. | 348/308 |
| 8,872,239 B2 | * | 10/2014 | Tashiro et al. | 257/239 |
| 2003/0193095 A1 | * | 10/2003 | Sasaki et al. | 257/784 |
| 2008/0029787 A1 | * | 2/2008 | Watanabe et al. | 257/233 |
| 2008/0217519 A1 | | 9/2008 | Yokomichi et al. | |
| 2009/0135651 A1 | * | 5/2009 | Kojima et al. | 365/185.16 |
| 2010/0245647 A1 | * | 9/2010 | Honda et al. | 348/308 |
| 2011/0194006 A1 | * | 8/2011 | Noda | 348/302 |
| 2011/0198482 A1 | * | 8/2011 | Ogura et al. | 250/208.1 |
| 2012/0018627 A1 | * | 1/2012 | Tredwell et al. | 250/252.1 |

(Continued)

FOREIGN PATENT DOCUMENTS

JP 2008-211591 A 9/2008

*Primary Examiner* — John Lee

(74) *Attorney, Agent, or Firm* — Brinks Gilson & Lione

(57) ABSTRACT

A photoelectric conversion device in which a parasitic capacitance between an optical signal common output line for commonly transmitting an optical signal and a control signal line and a parasitic capacitance between an initial voltage common output line for commonly transmitting an initial voltage and the control signal line in a plurality of photoelectric conversion units are substantially equal is provided. The control signal line is arranged so that the length of the wiring part of the control signal line in parallel with the optical signal common output line and the length of the wiring part of the control signal line in parallel with the initial voltage common output line are substantially equal and the distance between the control signal line and the optical signal common output line and the distance between the control signal line and the initial voltage common output line are substantially equal.

3 Claims, 6 Drawing Sheets

(56) References Cited

U.S. PATENT DOCUMENTS

| | | | |
|---|---|---|---|
| 2013/0071129 A1* | 3/2013 | Yoneda et al. | 398/214 |
| 2013/0161701 A1* | 6/2013 | Tashiro et al. | 257/239 |
| 2014/0027621 A1* | 1/2014 | Yokomichi | 250/208.2 |
| 2014/0036119 A1* | 2/2014 | Shimomura et al. | 348/294 |

* cited by examiner

PHOTOELECTRIC CONVERSION DEVICE

RELATED APPLICATIONS

This application claims priority under 35 U.S.C. §119 to Japanese Patent Application No. 2012-166155 filed on Jul. 26, 2012, the entire content of which is hereby incorporated by reference.

BACKGROUND OF THE INVENTION

1. Field of the Invention

The present invention relates to a layout structure of a photoelectric conversion device that outputs an output voltage based on incident light.

2. Background Art

Photoelectric conversion devices are currently used as image reading devices of facsimile machines, image scanners, digital copiers, X-ray imagers, and the like. Photoelectric conversion devices are manufactured using single-crystal silicon chips, and contact image sensors (CIS) are well known.

A photoelectric conversion device is described below.

FIG. 7 is a circuit diagram showing a photoelectric conversion unit. A photoelectric conversion unit 30 includes a photodiode 1, a reset switch 2, a buffer amplifier 3, a switch 14, a switch 15, a capacitor 12, a capacitor 13, a switch 16, and a switch 17.

The reset switch 2 and the buffer amplifier 3 are connected to an output terminal of the photodiode 1. The capacitor 12 is connected to an output terminal of the buffer amplifier 3 via the switch 14, and connected to an optical signal common output line 10 via the switch 16. The capacitor 13 is connected to the output terminal of the buffer amplifier 3 via the switch 15, and connected to an initial voltage common output line 11 via the switch 17.

The photodiode 1 generates a photocharge based on incident light, and outputs an optical signal based on the photocharge. The reset switch 2 resets a voltage of the output terminal of the photodiode 1 to a predetermined initial voltage. The buffer amplifier 3 amplifies the optical signal to output the amplified optical signal, and amplifies the initial voltage to output the amplified initial voltage. The capacitor 12 holds the amplified optical signal via the switch 14 controlled by a signal $\Phi SI$, and outputs the amplified optical signal to the optical signal common output line 10 via the switch 16 controlled by a signal $\Phi SCH$. The capacitor 13 holds the amplified initial voltage via the switch 15 controlled by the signal $\Phi RI$, and outputs the amplified initial voltage to the initial voltage common output line 11 via the switch 17 controlled by the signal $\Phi SCH$.

Here, due to the wiring layout, a parasitic capacitance 25 is generated between a control signal line 21 to which the signal $\Phi SCH$ is input and the optical signal common output line 10, and a parasitic capacitance 26 is generated between the control signal line 21 and the initial voltage common output line 11.

FIG. 8 is a circuit diagram showing an upstream part of the photoelectric conversion device. The upstream part of the photoelectric conversion device includes a plurality of photoelectric conversion units 30, the optical signal common output line 10, the initial voltage common output line 11, and a capacitor group 20.

The optical signal common output line 10 is commonly connected to all photoelectric conversion units 30, and has a first parasitic capacitance 31 which is the total sum of the parasitic capacitances 25 of all photoelectric conversion units 30. The initial voltage common output line 11 is commonly connected to all photoelectric conversion units 30, and has a second parasitic capacitance 32 which is the total sum of the parasitic capacitances 26 of all photoelectric conversion units 30. The capacitor group 20 is connected to the optical signal common output line 10 or the initial voltage common output line 11 via a metal wiring line 20z.

FIG. 9 is a circuit diagram showing an example of the capacitor group 20 in FIG. 8. The capacitor group 20 includes a plurality of capacitors 20a. The capacitance value of the capacitor group 20 is determined by whether or not a metal wiring line 20b corresponding to each capacitor 20a is present. The effects of the parasitic capacitances of the optical signal common output line 10 and the initial voltage common output line 11 can be eliminated by setting the capacitance value of the capacitor group 20 to the capacitance value difference between the first parasitic capacitance 31 and the second parasitic capacitance 32.

FIG. 10 is a circuit diagram showing a downstream part of the photoelectric conversion device. The downstream part of the photoelectric conversion device includes a buffer amplifier 22, a buffer amplifier 23, a subtraction amplifier 24, a clamp circuit 27, a sample and hold circuit 28, and a transmission gate 29.

The optical signal common output line 10 is connected to the subtraction amplifier 24 via the buffer amplifier 22. The initial voltage common output line 11 is connected to the subtraction amplifier 24 via the buffer amplifier 23. An output terminal of the subtraction amplifier 24 is connected to the clamp circuit 27. An output terminal of the clamp circuit 27 is connected to the sample and hold circuit 28. An output terminal of the sample and hold circuit 28 is connected to the transmission gate 29. It is therefore important to eliminate the effects of the parasitic capacitances on the signals before being amplified by the buffer amplifiers 22 and 23, for improved output signal accuracy (for example, see Patent Document 1).

[Patent Document 1] Japanese Patent Application Laid-Open No. 2008-211591

SUMMARY OF THE INVENTION

However, the photoelectric conversion device has the following problem. The length of the IC chip in the main scanning direction needs to be the same as the document length, and so cannot be decreased. Accordingly, for chip size reduction and cost reduction, it is necessary to decrease the shorter side of the IC chip in the sub-scanning direction. When the width of the IC chip in the shorter side direction is more significantly decreased, the distance between the optical signal common output line 10, the initial voltage common output line 11, and the control signal line 21 becomes smaller, incurring greater effects of the parasitic capacitance 25 and the parasitic capacitance 26. Besides, a higher resolution requires a larger number of photoelectric conversion units 30, which causes an increase in capacitance value of the first parasitic capacitance 31 and the second parasitic capacitance 32, and thus an increase in capacitance value difference between the first parasitic capacitance 31 and the second parasitic capacitance 32. Such a capacitance value difference cannot be corrected by the capacitor group 20 alone.

The present invention has been developed in view of the above, and provides an accurate photoelectric conversion device by reducing the difference in parasitic capacitance between the output lines to thereby reduce the effects on the optical signal.

To solve the conventional problem, in the photoelectric conversion device according to the present invention, the control signal line is arranged so that the length of the wiring part of the control signal line in parallel with the optical signal common output line and the length of the wiring part of the control signal line in parallel with the initial voltage common output line are substantially equal and the distance between the control signal line and the optical signal common output line and the distance between the control signal line and the initial voltage common output line are substantially equal.

In the photoelectric conversion device according to the present invention, the parasitic capacitance between the optical signal common output line for commonly transmitting the optical signal and the control signal line and the parasitic capacitance between the initial voltage common output line for commonly transmitting the initial voltage and the control signal line in the plurality of photoelectric conversion units are substantially equal. Therefore, the effects of the parasitic capacitances on the optical signal can be eliminated.

DETAILED DESCRIPTION OF THE PREFERRED EMBODIMENTS

The following describes a layout of a photoelectric conversion device according to an embodiment of the present invention in detail, with reference to drawings.

Figure 1:
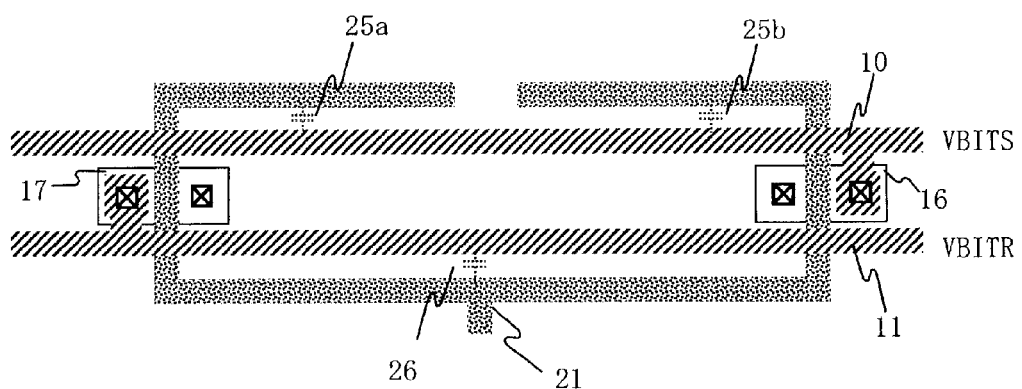
FIG. 1 is a plan view showing a layout of a switch portion in a photoelectric conversion device according to an embodiment of the present invention.

FIG. 1 is a plan view showing a layout of a region 40 in the photoelectric conversion unit 30 according to the embodiment of the present invention. The optical signal common output line 10 and the initial voltage common output line 11 are metal (e.g. aluminum) wiring lines, and are arranged in parallel with each other. The switch 16 is disposed between the optical signal common output line 10 and the initial voltage common output line 11, and connected to the optical signal common output line 10. The switch 17 is disposed between the optical signal common output line 10 and the initial voltage common output line 11, and connected to the initial voltage common output line 11.

The control signal line 21 is a polysilicon wiring line, and is arranged in parallel with the initial voltage common output line 11. Further, the control signal line 21 intersects with the initial voltage common output line 11, and is connected to the switch 17. The control signal line 21 also intersects with the initial voltage common output line 11, and is connected to the switch 16. The control signal line 21 then intersects with the optical signal common output line 10, and is arranged in parallel with the optical signal common output line 10. To make the parasitic capacitance 25 (25a+25b) and the parasitic capacitance 26 substantially equal, the control signal line 21 is provided so that the length of the wiring part of the control signal line 21 in parallel with the optical signal common output line 10 and the length of the wiring part of the control signal line 21 in parallel with the initial voltage common output line 11 are substantially equal and the distance between the control signal line 21 and the optical signal common output line 10 and the distance between the control signal line 21 and the initial voltage common output line 11 are substantially equal.

As a result of wiring the control signal line 21 in this way, the parasitic capacitance 25 and the parasitic capacitance 26 are substantially equal, and so the first parasitic capacitance 31 which is the total sum of the parasitic capacitances 25 and the second parasitic capacitance 32 which is the total sum of the parasitic capacitances 26 are substantially equal. Hence, the capacitor group 20 for correcting the capacitance difference between the first parasitic capacitance 31 and the second parasitic capacitance 32 may be reduced in size or omitted.

In the case where the optical signal common output line 10 and the initial voltage common output line 11 are metal wiring lines and the control signal line 21 is a polysilicon wiring line, there is a possibility that their masks are displaced. In such a case, even if the control signal line 21 is wired as mentioned above, the distance between the control signal line 21 and the optical signal common output line 10 and the distance between the control signal line 21 and the initial voltage common output line 11 are not equal. This causes a difference in capacitance value between the parasitic capacitance 25 and the parasitic capacitance 26.

Such wiring layouts that make the parasitic capacitance 25 and the parasitic capacitance 26 substantially equal even when the masks of the metal wiring line and the polysilicon wiring line are displaced are described in the following embodiments.

Figure 2:
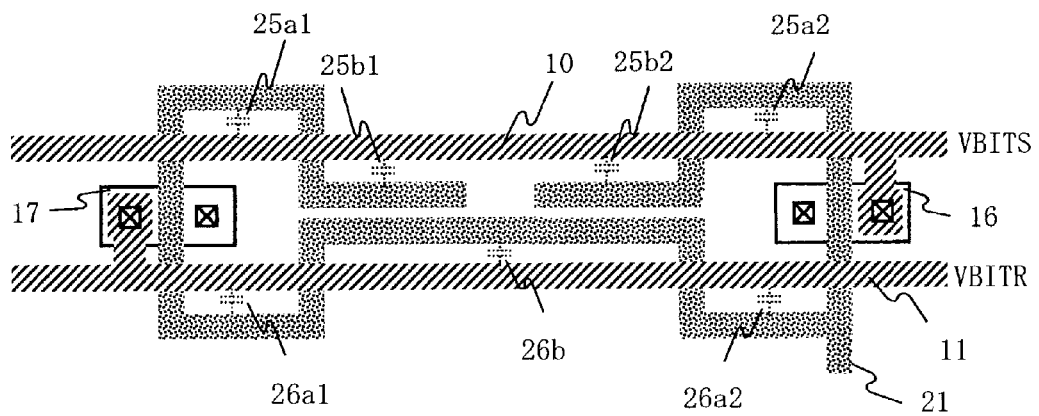
FIG. 2 is a plan view showing another example of the layout of the switch portion in the photoelectric conversion device.

FIG. 2 is a plan view showing another example of the layout of the region 40 in the photoelectric conversion unit 30.

The optical signal common output line 10 and the initial voltage common output line 11 which are metal wiring lines are arranged in parallel with each other. The switch 16 is disposed between the optical signal common output line 10 and the initial voltage common output line 11, and connected to the optical signal common output line 10. The switch 17 is disposed between the optical signal common output line 10 and the initial voltage common output line 11, and connected to the initial voltage common output line 11.

The control signal line 21 which is a polysilicon wiring line branches in two directions near the initial voltage common output line 11 in the right side of the drawing. One control signal line 21 is arranged in parallel with the initial voltage common output line 11, and the other control signal line 21 intersects with the initial voltage common output line 11, the switch 16, and the optical signal common output line 10 and then is arranged in parallel with the optical signal common output line 10. The one control signal line 21 intersects with the initial voltage common output line 11 and then is arranged in parallel with the initial voltage common output line 11, and again intersects with the initial voltage common output line 11 and then is arranged in parallel with the initial voltage common output line 11. The one control signal line 21 intersects with the initial voltage common output line 11, the switch 17, and the optical signal common output line 10 and then is arranged in parallel with the optical signal common output line 10, and again intersects with the optical signal common output line 10 and then is arranged in parallel with the optical signal common output line 10. The other control signal line 21 again intersects with the optical signal common output line 10 and then is arranged in parallel with the optical signal common output line 10.

A parasitic capacitance 25a1 is generated between the control signal line 21 outside the optical signal common output line 10 and the optical signal common output line 10 in the left side of the drawing, and a parasitic capacitance 25a2 is generated in the same part in the right side of the drawing. Parasitic capacitances 25b1 and 25b2 are generated between the control signal line 21 inside the optical signal common output line 10 and the optical signal common output line 10 in the center of the drawing. A parasitic capacitance 26a1 is generated between the control signal line 21 outside the initial voltage common output line 11 and the initial voltage common output line 11 in the left side of the drawing, and a parasitic capacitance 26a2 is generated in the same part in the right side of the drawing. A parasitic capacitance 26b is generated between the control signal line 21 inside the initial voltage common output line 11 and the initial voltage common output line 11 in the center of the drawing.

Figure 7:
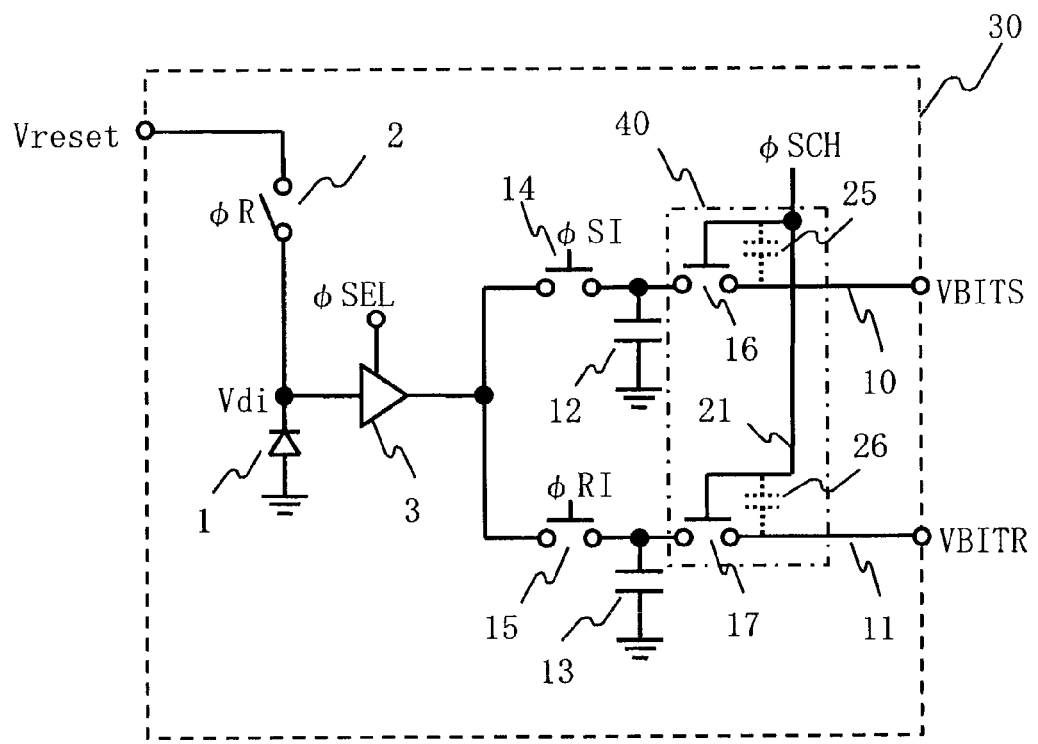
FIG. 7 is a circuit diagram showing a photoelectric conversion unit.
Figure 8:
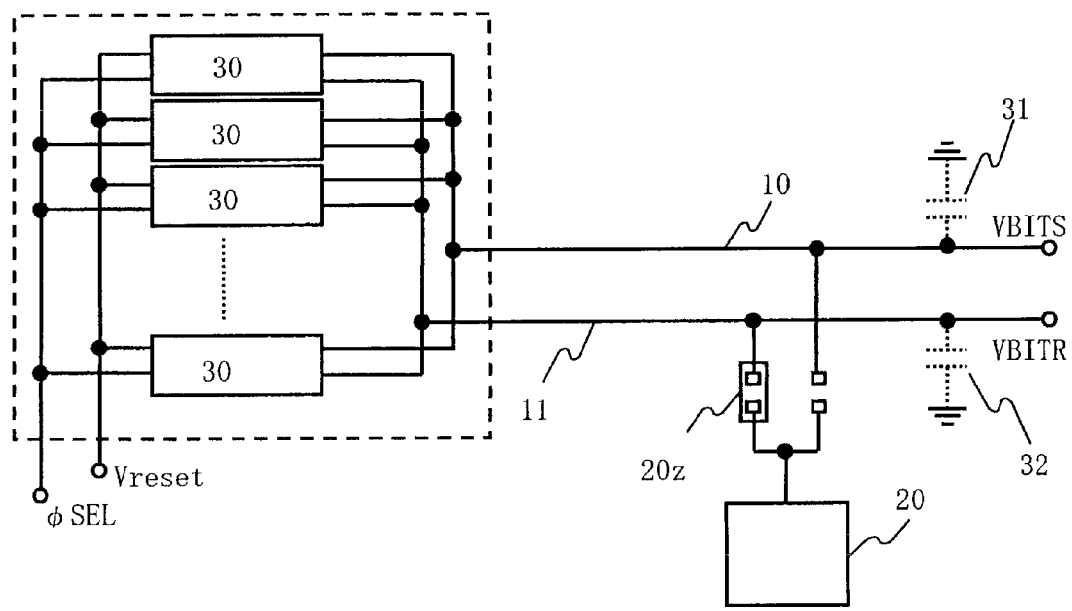
FIG. 8 is a circuit diagram showing an upstream part of a photoelectric conversion device.
Figure 9:
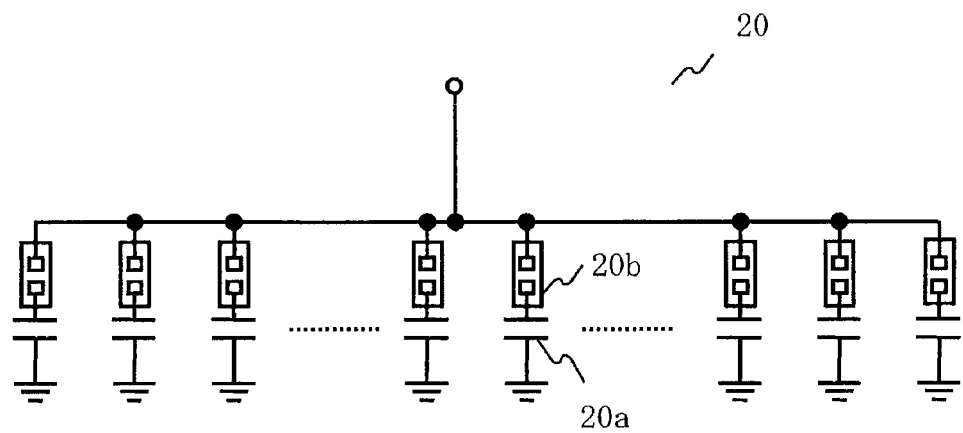
FIG. 9 is a diagram showing a capacitor group in the photoelectric conversion device.
Figure 10:
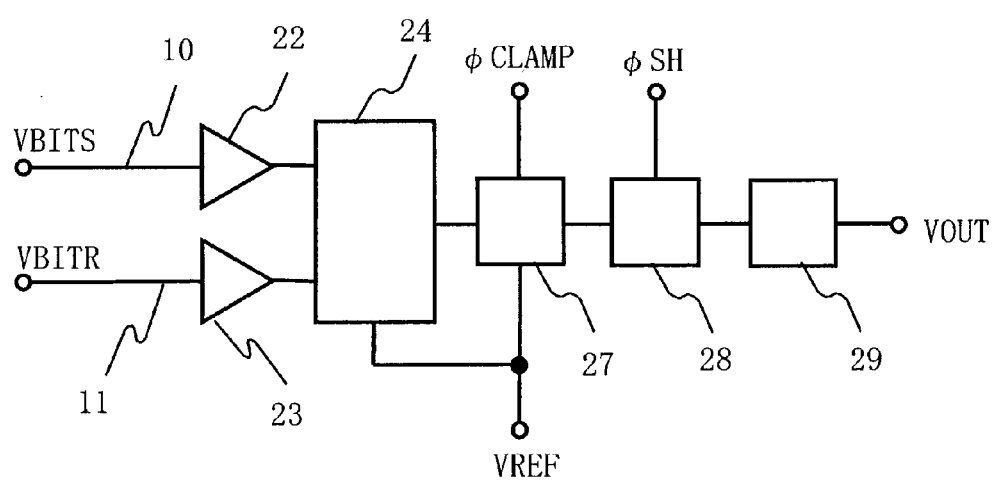
FIG. 10 is a circuit diagram showing a downstream part of the photoelectric conversion device.

The total capacitance value of the parasitic capacitances 25a1, 25a2, 25b1, and 25b2 corresponds to the capacitance value of the parasitic capacitance 25 in FIG. 7. The wiring is performed so that the total capacitance value of the parasitic capacitances 25a1 and 25a2 and the total capacitance value of the parasitic capacitances 25b1 and 25b2 are equal. Here, the wiring is performed so that the wiring distance between the optical signal common output line 10 and the outside control signal line 21 and the wiring length of the outside control signal line 21 are equal to the wiring distance between the optical signal common output line 10 and the inside control signal line 21 and the wiring length of the inside control signal line 21. The total capacitance value of the parasitic capacitances 26a1, 26a2, and 26b corresponds to the capacitance value of the parasitic capacitance 26 in FIG. 7. The wiring is performed so that the total capacitance value of the parasitic capacitances 26a1 and 26a2 and the capacitance value of the parasitic capacitance 26b are equal. Here, the wiring is performed so that the wiring distance between the initial voltage common output line 11 and the outside control signal line 21 and the wiring length of the outside control signal line 21 are equal to the wiring distance between the initial voltage common output line 11 and the inside control signal line 21 and the wiring length of the inside control signal line 21. Furthermore, the wiring is performed so that the wiring distances and the wiring lengths are all equal, to make the total parasitic capacitance 25 and the total parasitic capacitance 26 equal in capacitance value.

The following describes a state in which the metal mask of the optical signal common output line 10 and the initial voltage common output line 11 and the polysilicon mask of the control signal line 21 are displaced. When the masks are displaced, the distance between the control signal line 21 and the optical signal common output line 10 and the distance between the control signal line 21 and the initial voltage common output line 11 are not equal, and as a result the capacitance value of each parasitic capacitance changes. For example, in the case where the metal mask is displaced upward in the drawing with respect to the polysilicon mask, the capacitance values of the parasitic capacitances 25a1, 25a2, and 25b increase whereas the capacitance values of the parasitic capacitances 25b1, 25b2, 26a1, and 26a2 decrease. Thus, the change of the capacitance value of the total parasitic capacitance 25 is limited to a small extent. Likewise, the change of the capacitance value of the total parasitic capacitance 26 is limited to a small extent. Moreover, the change of the capacitance value of the parasitic capacitance 25 and the change of the capacitance value of the parasitic capacitance 26 are substantially equal.

As described above, even when the metal mask and the polysilicon mask are displaced, the changes of the capacitance values of the parasitic capacitances 25 and 26 are small and are substantially equal. Hence, the balance between the capacitance values of the parasitic capacitances 25 and 26 is maintained. The effects of the parasitic capacitances on the optical signal can therefore be reduced.

Figure 3:
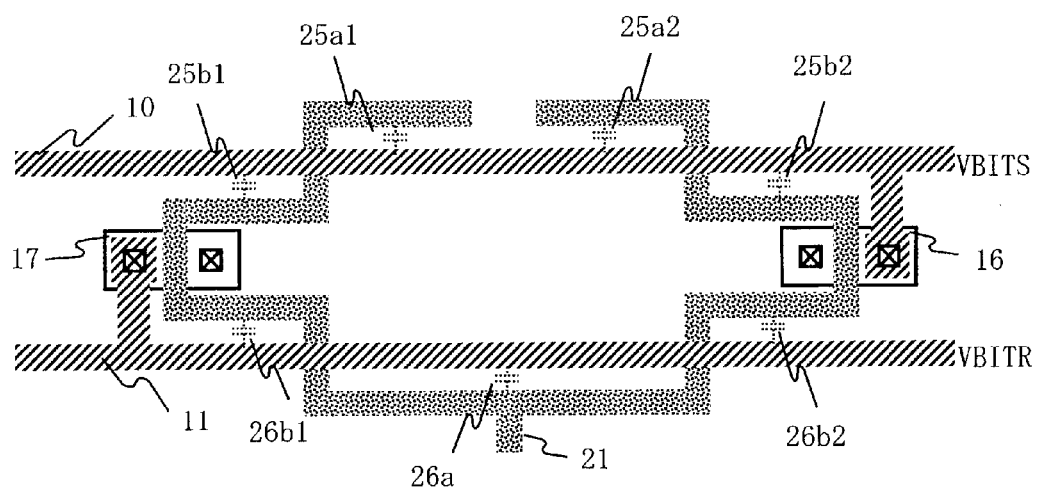
FIG. 3 is a plan view showing another example of the layout of the switch portion in the photoelectric conversion device.

FIG. 3 is a plan view showing another example of the layout of the region 40 in the photoelectric conversion unit 30.

The control signal line 21 which is a polysilicon wiring line branches in two directions near the initial voltage common output line 11 in the center of the drawing, and is arranged in parallel with the initial voltage common output line 11 in left-right symmetry. The control signal line 21 in the left side of the drawing intersects with the initial voltage common output line 11 and then is arranged in parallel with the initial voltage common output line 11, intersects with the switch 17 and then is arranged in parallel with the optical signal common output line 10, and intersects with the optical signal common output line 10 and then is arranged in parallel with the optical signal common output line 10. The control signal line 21 in the right side of the drawing intersects with the initial voltage common output line 11 and then is arranged in parallel with the initial voltage common output line 11, intersects with the switch 16 and then is arranged in parallel with the optical signal common output line 10, and intersects with the optical signal common output line 10 and then is arranged in parallel with the optical signal common output line 10.

The parasitic capacitance 25a1 is generated between the control signal line 21 outside the optical signal common output line 10 and the optical signal common output line 10 in the center left side of the drawing, and the parasitic capacitance 25a2 is generated in the same part in the center right side of the drawing. The parasitic capacitance 25b1 is generated between the control signal line 21 inside the optical signal common output line 10 and the optical signal common output line 10 in the left side of the drawing, and the parasitic capacitance 25b2 is generated in the same part in the right side of the drawing. A parasitic capacitance 26a is generated between the control signal line 21 outside the initial voltage common output line 11 and the initial voltage common output line 11 in the center of the drawing. A parasitic capacitance 26b1 is generated between the control signal line 21 inside the initial voltage common output line 11 and the initial voltage common output line 11 in the left side of the drawing, and a parasitic capacitance 26b2 is generated in the same part in the right side of the drawing.

The wiring is performed so that the total capacitance value of the parasitic capacitances 25a1 and 25a2 and the total capacitance value of the parasitic capacitances 25b1 and 25b2 are equal. Here, the wiring is performed so that the wiring distance between the optical signal common output line 10 and the outside control signal line 21 and the wiring length of the outside control signal line 21 are equal to the wiring distance between the optical signal common output line 10 and the inside control signal line 21 and the wiring length of the inside control signal line 21. Moreover, the wiring is performed so that the capacitance value of the parasitic capacitance 26a and the total capacitance value of the parasitic capacitances 26b1 and 26b2 are equal. Here, the wiring is performed so that the wiring distance between the initial voltage common output line 11 and the outside control signal line 21 and the wiring length of the outside control signal line 21 are equal to the wiring distance between the initial voltage common output line 11 and the inside control signal line 21 and the wiring length of the inside control signal line 21. Furthermore, the wiring is performed so that the wiring distances and the wiring lengths are all equal, to make the total parasitic capacitance 25 and the total parasitic capacitance 26 equal in capacitance value.

In this layout as in the layout in FIG. 2, even when the metal mask and the polysilicon mask are displaced, the changes of the capacitance values of the parasitic capacitances 25 and 26 are small and are substantially equal. Hence, the balance between the capacitance values of the parasitic capacitances 25 and 26 is maintained. The effects of the parasitic capacitances on the optical signal can therefore be reduced.

Figure 4:
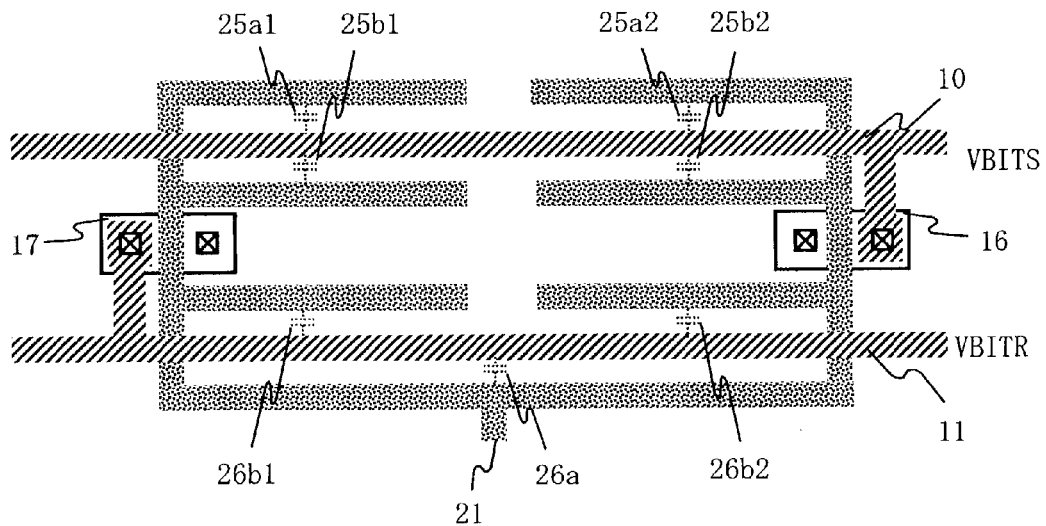
FIG. 4 is a plan view showing another example of the layout of the switch portion in the photoelectric conversion device.

FIG. 4 is a plan view showing another example of the layout of the region 40 in the photoelectric conversion unit 30.

The control signal line 21 which is a polysilicon wiring line branches in two directions near the initial voltage common output line 11 in the center of the drawing, and is arranged in parallel with the initial voltage common output line 11 in left-right symmetry. The control signal line 21 in the left side of the drawing intersects with the initial voltage common output line 11 and then branches in two directions. One control signal line 21 is arranged in parallel with the initial voltage common output line 11, and the other control signal line 21 intersects with the switch 17 and then further branches in two directions. One control signal line 21 is arranged in parallel with the optical signal common output line 10, and the other control signal line 21 intersects with the optical signal common output line 10 and then is arranged in parallel with the optical signal common output line 10. The control signal line 21 in the right side of the drawing is arranged symmetrically with the control signal line 21 in the left side of the drawing.

The parasitic capacitance 25a1 is generated between the control signal line 21 outside the optical signal common output line 10 and the optical signal common output line 10 in the left side of the drawing, and the parasitic capacitance 25a2 is generated in the same part in the right side of the drawing. The parasitic capacitance 25b1 is generated between the control signal line 21 inside the optical signal common output line 10 and the optical signal common output line 10 in the left side of the drawing, and the parasitic capacitance 25b2 is generated in the same part in the right side of the drawing. The parasitic capacitance 26a is generated between the control signal line 21 outside the initial voltage common output line 11 and the initial voltage common output line 11 in the center of the drawing. The parasitic capacitance 26b1 is generated between the control signal line 21 inside the initial voltage common output line 11 and the initial voltage common output line 11 in the left side of the drawing, and the parasitic capacitance 26b2 is generated in the same part in the right side of the drawing.

The wiring is performed so that the total capacitance value of the parasitic capacitances 25a1 and 25a2 and the total capacitance value of the parasitic capacitances 25b1 and 25b2 are equal. Here, the wiring is performed so that the wiring distance between the optical signal common output line 10 and the outside control signal line 21 and the wiring length of the outside control signal line 21 are equal to the wiring distance between the optical signal common output line 10 and the inside control signal line 21 and the wiring length of the inside control signal line 21. Moreover, the wiring is performed so that the capacitance value of the parasitic capacitance 26a and the total capacitance value of the parasitic capacitances 26b1 and 26b2 are equal. Here, the wiring is performed so that the wiring distance between the initial voltage common output line 11 and the outside control signal line 21 and the wiring length of the outside control signal line 21 are equal to the wiring distance between the initial voltage common output line 11 and the inside control signal line 21 and the wiring length of the inside control signal line 21. Furthermore, the wiring is performed so that the wiring distances and the wiring lengths are all equal, to make the total parasitic capacitance 25 and the total parasitic capacitance 26 equal in capacitance value.

In this layout as in the layout in FIG. 2, even when the metal mask and the polysilicon mask are displaced, the changes of the capacitance values of the parasitic capacitances 25 and 26 are small and are substantially equal. Hence, the balance between the capacitance values of the parasitic capacitances 25 and 26 is maintained. The effects of the parasitic capacitances on the optical signal can therefore be reduced.

Figure 5:
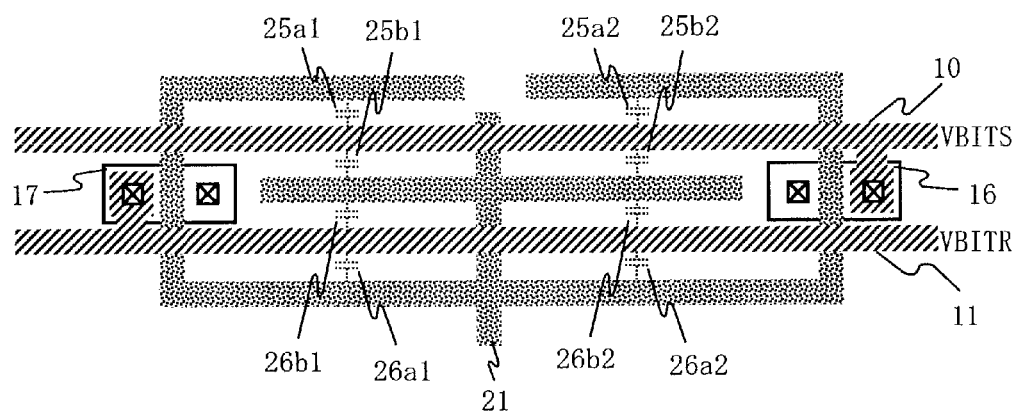
FIG. 5 is a plan view showing another example of the layout of the switch portion in the photoelectric conversion device.

FIG. 5 is a plan view showing another example of the layout of the region 40 in the photoelectric conversion unit 30.

The control signal line 21 which is a polysilicon wiring line branches in three directions near the initial voltage common output line 11 in the center of the drawing, one intersecting with the initial voltage common output line 11, and the other being arranged in parallel with the initial voltage common output line 11 in left-right symmetry. The control signal line 21 in the left side of the drawing intersects with the initial voltage common output line 11, the switch 17, and the optical signal common output line 10, and then is arranged in parallel with the optical signal common output line 10. The control signal line 21 in the right side of the drawing is arranged symmetrically with the control signal line 21 in the left side of the drawing. The control signal line 21 in the center of the drawing intersects with the initial voltage common output line 11, and then is arranged in parallel with the optical signal common output line 10 and the initial voltage common output line 11 in left-right symmetry.

The parasitic capacitance 25a1 is generated between the control signal line 21 outside the optical signal common output line 10 and the optical signal common output line 10 in the left side of the drawing, and the parasitic capacitance 25a2 is generated in the same part in the right side of the drawing. The parasitic capacitance 25b1 is generated between the control signal line 21 inside the optical signal common output line 10 and the optical signal common output line 10 in the left side of the drawing, and the parasitic capacitance 25b2 is generated in the same part in the right side of the drawing. The parasitic capacitance 26a1 is generated between the control signal line 21 outside the initial voltage common output line 11 and the initial voltage common output line 11 in the left side of the drawing, and the parasitic capacitance 26a2 is generated in the same part in the right side of the drawing. The parasitic capacitance 26b1 is generated between the control signal line 21 inside the initial voltage common output line 11 and the initial voltage common output line 11 in the left side of the drawing, and the parasitic capacitance 26b2 is generated in the same part in the right side of the drawing.

The wiring is performed so that the total capacitance value of the parasitic capacitances 25a1 and 25a2 and the total capacitance value of the parasitic capacitances 25b1 and 25b2 are equal. Here, the wiring is performed so that the wiring distance between the optical signal common output line 10 and the outside control signal line 21 and the wiring length of the outside control signal line 21 are equal to the wiring distance between the optical signal common output line 10 and the inside control signal line 21 and the wiring length of the inside control signal line 21. Moreover, the wiring is performed so that the total capacitance value of the parasitic capacitances 26a1 and 26a2 and the total capacitance value of the parasitic capacitances 26b1 and 26b2 are equal. Here, the wiring is performed so that the wiring distance between the initial voltage common output line 11 and the outside control signal line 21 and the wiring length of the outside control signal line 21 are equal to the wiring distance between the initial voltage common output line 11 and the inside control signal line 21 and the wiring length of the inside control signal line 21. Furthermore, the wiring is performed so that the wiring distances and the wiring lengths are all equal, to make the total parasitic capacitance 25 and the total parasitic capacitance 26 equal in capacitance value.

In this layout as in the layout in FIG. 2, even when the metal mask and the polysilicon mask are displaced, the changes of the capacitance values of the parasitic capacitances 25 and 26 are small and are substantially equal. Hence, the balance between the capacitance values of the parasitic capacitances 25 and 26 is maintained. The effects of the parasitic capacitances on the optical signal can therefore be reduced.

Figure 6:
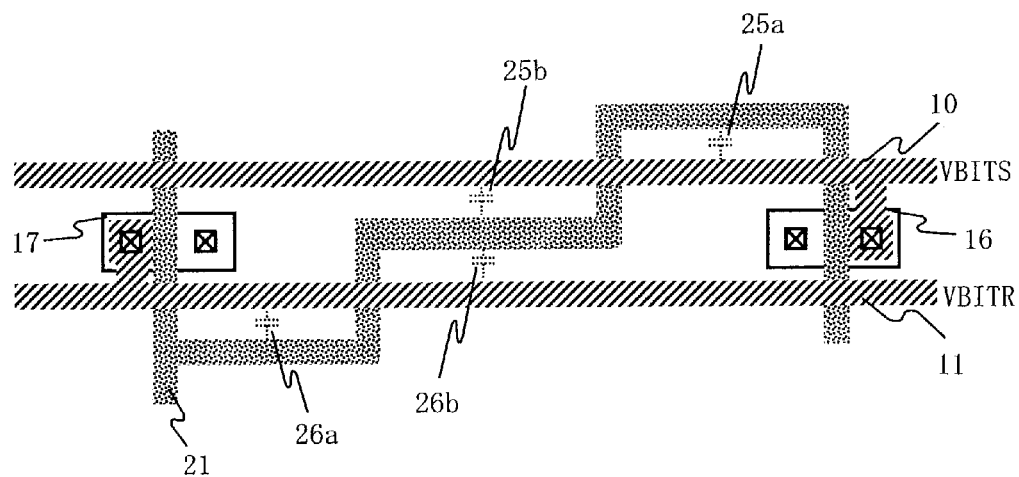
FIG. 6 is a plan view showing another example of the layout of the switch portion in the photoelectric conversion device.

FIG. 6 is a plan view showing another example of the layout of the region 40 in the photoelectric conversion unit 30.

The control signal line 21 which is a polysilicon wiring line branches in two directions near the initial voltage common output line 11 in the left side of the drawing. One control signal line 21 intersects with the initial voltage common output line 11, and the other control signal line 21 is arranged in parallel with the initial voltage common output line 11. The one control signal line 21 intersects with the initial voltage common output line 11 and the switch 17. The other control signal line 21 intersects with the initial voltage common output line 11 and then is arranged in parallel with the optical signal common output line 10 and the initial voltage common output line 11, and intersects with the optical signal common output line 10 and then is arranged in parallel with the optical signal common output line 10. The other control signal line 21 then intersects with the optical signal common output line 10 again and the switch 16.

The parasitic capacitance 25a is generated between the control signal line 21 outside the optical signal common output line 10 and the optical signal common output line 10 in the right side of the drawing. The parasitic capacitance 25b is generated between the inside control signal line 21 and the optical signal common output line 10 and the parasitic capacitance 26b is generated between the inside control signal line 21 and the initial voltage common output line 11 in the center of the drawing. The parasitic capacitance 26a is generated between the control signal line 21 outside the initial voltage common output line 11 and the initial voltage common output line 11 in the left side of the drawing.

The wiring is performed so that the capacitance value of the parasitic capacitance 25a and the capacitance value of the parasitic capacitance 25b are equal. Here, the wiring is performed so that the wiring distance between the optical signal common output line 10 and the outside control signal line 21 and the wiring length of the outside control signal line 21 are equal to the wiring distance between the optical signal common output line 10 and the inside control signal line 21 and the wiring length of the inside control signal line 21. Moreover, the wiring is performed so that the capacitance value of the parasitic capacitance 26a and the capacitance value of the parasitic capacitance 26b are equal. Here, the wiring is performed so that the wiring distance between the initial voltage common output line 11 and the outside control signal line 21 and the wiring length of the outside control signal line 21 are equal to the wiring distance between the initial voltage common output line 11 and the inside control signal line 21 and the wiring length of the inside control signal line 21. Furthermore, the wiring is performed so that the wiring distances and the wiring lengths are all equal, to make the total parasitic capacitance 25 and the total parasitic capacitance 26 equal in capacitance value.

In this layout as in the layout in FIG. 2, even when the metal mask and the polysilicon mask are displaced, the changes of the capacitance values of the parasitic capacitances 25 and 26 are small and are substantially equal. Hence, the balance between the capacitance values of the parasitic capacitances 25 and 26 is maintained. The effects of the parasitic capacitances on the optical signal can therefore be reduced.

Note that the wiring layouts described with reference to the drawings are examples of such a wiring layout that makes the capacitance value of the parasitic capacitance 25a and the capacitance value of the parasitic capacitance 25b equal, the capacitance value of the parasitic capacitance 26a and the capacitance value of the parasitic capacitance 26b equal, and further the capacitance values of the total parasitic capacitances 25 and 26 equal, and the present invention is not limited to these layouts.

What is claimed is:

1. A photoelectric conversion device comprising:
    a plurality of photoelectric conversion units;
    a first wiring line commonly transmitting optical signals of the plurality of photoelectric conversion units via a first switch;
    a second wiring line commonly transmitting initial voltages of the plurality of photoelectric conversion units via a second switch; and
    a third wiring line transmitting control signals that control the first switch and the second switch, the third wiring line crossing the first wiring line and the second wiring line,
    wherein in the plurality of photoelectric conversion units, the first wiring line, the second wiring line, and the third wiring line are located so that a first parasitic capacitance generated between the first wiring line and the third wiring line and a second parasitic capacitance generated between the second wiring line and the third wiring line are substantially equal.

2. The photoelectric conversion device according to claim 1, wherein the third wiring line is configured such that a length of a wiring part of the third wiring line in parallel with the first wiring line and a length of a wiring part of the third wiring line in parallel with the second wiring line are substantially equal and a distance between the third wiring line and the first wiring line and a distance between the third wiring line and the second wiring line are substantially equal.

3. The photoelectric conversion device according to claim 1, wherein the third wiring line comprises first and second wiring parts in parallel with the first wiring line and the first and second wiring parts reside on opposite sides of the first wiring line and a length of the first and second wiring parts are substantially equal on both sides of the first wiring line.

* * * * *